(12) United States Patent
Khwa (10) Patent No.: US 11,456,040 B2
(45) Date of Patent: Sep. 27, 2022

(54) MEMORY DEVICE AND ERROR CORRECTION METHOD IN MEMORY DEVICE

(71) Applicant: Taiwan Semiconductor Manufacturing Company, Ltd., Hsinchu (TW)

(72) Inventor: Win-San Khwa, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/185,927

(22) Filed: Feb. 25, 2021

(65) Prior Publication Data

US 2022/0270692 A1    Aug. 25, 2022

(51) Int. Cl.
*G11C 16/10* (2006.01)
*G11C 16/34* (2006.01)
*G11C 16/30* (2006.01)
*G11C 16/24* (2006.01)
*G11C 16/26* (2006.01)

(52) U.S. Cl.
CPC .......... *G11C 16/3459* (2013.01); *G11C 16/10* (2013.01); *G11C 16/24* (2013.01); *G11C 16/26* (2013.01); *G11C 16/30* (2013.01)

(58) Field of Classification Search
CPC ..... G11C 16/3459; G11C 16/10; G11C 16/24; G11C 16/26; G11C 16/30
See application file for complete search history.

(56) References Cited

U.S. PATENT DOCUMENTS

2022/0059172 A1*   2/2022   Yu ................... G11C 16/3431

* cited by examiner

*Primary Examiner* — Xiaochun L Chen
(74) *Attorney, Agent, or Firm* — JCIPRNET (57) ABSTRACT

A memory device and a method of correcting error in a memory device is provided. The memory device controller includes a memory array, a tie-breaker array, a write controller, a verify circuit, and a controller. The memory array includes a plurality of memory cells. The tie-breaker array includes a plurality of tie-breaker rows. The write controller is configured to apply a programming voltage to the memory array. The verify circuit is configured to apply a verify voltage to verify whether the memory cells in the memory array are in an unambiguous state or not. The controller is configured to enable one or more tie-breaker rows in additions to the memory array to adjust an output of the memory array when the memory cells in the memory array are in an ambiguous state.

20 Claims, 5 Drawing Sheets

MEMORY DEVICE AND ERROR CORRECTION METHOD IN MEMORY DEVICE

BACKGROUND

In a memory device, ECC is a conventional practice to correct a plurality of data bits if an error bit occurs in the memory device. However, it is incompatible for the memory device with the function of in-memory computing since an output of the in-memory computing corresponds to a product sum of a memory array in the memory device without obtaining a value of each bit in the memory array. In particular, in-memory computing is performed within the memory device. The memory array includes a plurality of memory cells, where the memory cells are categorized into a plurality of data bits and a plurality of parity bits. The in-memory computing is performed by applying a read voltage to the data bits in the memory array, thereby inducing a read current to pass through the data bits through a corresponding bit line to a sense amplifier. The read current passing through the data bits may be accumulated on the bit line. In other words, an output of the memory device is a sum of products between a plurality of inputs and a plurality of weights of the data bits in the memory array, which is also known as a product sum. By this in-memory computing method, the parity bits do not help correcting the data bits or the product sum on the bit line.

Therefore, there is a need to design the memory device with efficient in-memory computing error correction in the memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
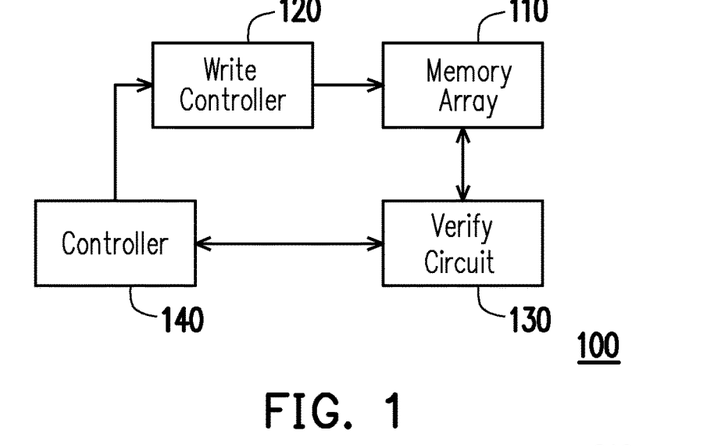
FIG. 1 illustrates a block diagram of a memory device according to an exemplary embodiment of the disclosure.

FIG. 1 illustrates a block diagram of a memory device according to an exemplary embodiment of the disclosure. The memory device 100 includes a memory array 110, a write controller 120, a verify circuit 130, and a controller 140. In some embodiments, the memory array 110, the write controller 120, the verify circuit 130, and the controller 140 may be integrated into a single chip. In some embodiments, the write controller 120, the verify circuit 130, and the controller 140 may be implemented by an external device.

The memory device 100 may be a volatile memory device and/or a non-volatile memory device, thus a type of the memory device 100 is not limited in this disclosure. The memory array 110 includes a plurality of memory cells and is configured to store data. The row direction of the memory array 110 refers a word line direction and the column direction of the memory array 110 refers to a bit line direction. In other words, the memory cells are arranged corresponding to each of a plurality of word lines and each of a plurality of bit lines. The memory cells in the memory array 110 includes a plurality of message bits for storing message data and a plurality of parity bits for storing parity data. In some embodiments, the number of bits of the message data is 8-bit and the number of bits of the parity data is 2-bit. It is noted that, the number of bits in the message data and the parity data in the memory array 110 is determined according to the size of the memory array 110.

The memory cells in the memory array 110 may be one-time programming (OTP) memory cells, flash memory cells or electrically-erasable programmable read-only memory (EEPROM) cells. An OTP memory cell may have one writing cycle, a flash memory cell may have 100 k writing cycles, and an EEPROM cell may have 1 k writing cycles, and the type of the memory cells in the memory array 110 is not limited in this disclosure.

The write controller 120 is configured to perform a programming operation in the memory array 110. In detail, the programming operation in the memory array 110 is performed by applying a programming voltage to the memory array 110. The programming operation in this embodiment raises an in-memory computing operation in the memory array 110, in which the inputs supplied to the memory cells are weighted and accumulated to generate a computing result.

During the in-memory computing operation, the programming voltage is applied to the memory cells in the memory array 110 to induce a read current passing through the memory cells on the bit lines BLs to a sense amplifier in the memory device 100. The read current passing through each of the memory cells is accumulated in the corresponding bit lines. In some embodiments, a plurality of inputs $I_1$, $I_2$, $I_3$, ... $I_n$ supplied to the memory cells in a bit line of the memory array 110 are respectively multiplied by a plurality of weights $W_1$, $W_2$, $W_3$, ... $W_n$ of the memory cells to generate a plurality of products, and the products are summed as an output of the bit line. The sum of products of the inputs and the weights is referred to as a product sum. The plurality of weights $W_1$, $W_2$, $W_3$, ... $W_n$ of the memory cells refers to the binary values programed and stored in respective memory cells in the memory array 110. For example, a high resistance state (HRS) and a low resistance state (LRS) of the memory cell may respectively represent a weight of '0' and a weight of '1' of the memory cell.

It is noted that, each of the bit lines includes a set of the memory cells. The controller 140 is configured to calculate a product sum of inputs to the set of the memory cells and weights programmed to the set of the memory cells. In some embodiments, a multiply-and-accumulate (MAC) logic circuit is used for calculating the product sum.

The verify circuit 130 is configured to apply a verify voltage to verify whether the memory cells in the memory array 110 are in an unambiguous state or not. In some embodiments, the verify voltage is generated from a reference array disposed inside the memory device 100. In some embodiments, the verify voltage is generated from an external device.

The unambiguous state of the memory cells in the memory device 100 is determined by comparing the product sums of the bit lines with the verify voltage.

In a normal situation, the verify voltage is generated and serves as a threshold to distinguish the outputs of the bit lines, and accordingly the product sum of the bit line greater than the threshold is determined as a desired result.

In some embodiments, if one of the bits stored in the memory cells of the bit line has been flipped (e,g., changed from 0 to 1 or from 1 to 0), the product sum of the bit line is changed, which may cause the desired result to be ambiguous. That is, if a product sum output by the bit line without the flipped bit and a product sum output by the bit line with the flipped bit are both greater than or less than the verify voltage, then the desired result becomes ambiguous (i.e., the memory cells in the bit lines are determined to be in the ambiguous state) since it is unknown which product sum is the desired result.

Accordingly, the verify circuit 130 verifies the memory cells in the bit line are in the ambiguous state if a comparison result of bit line with the flipped bit is same as the comparison result of the bit line without the flipped bit.

After determination, the controller 140 is configured to enable a tie-breaker array when the memory cells in the memory array 110 are in the ambiguous state. In other words, the tie-breaker array is programmed to make the memory cells in the memory array 110 in the unambiguous state.

In some embodiments, the tie-breaker array is programmed by the controller 140 to adjust the verify voltage to make the memory cells in the memory array 110 to be in the unambiguous state.

In some embodiments, the tie-breaker array is programmed by the controller 140 to correct the outputs of the bit lines to make the memory cells in the memory array 110 to be in the unambiguous state.

In some embodiments, the controller 140 adjusts the verify voltage by a bias generation, which is performed by the bias generator. The bias generator is well-known in the art and thus the detail operations and the circuit of the bias generator is omitted herein.

Based on the above, the tie-breaker array is enabled and programmed by the controller to correct the output of the memory cells, thereby the product sum is corrected and reliability of the memory device is enhanced.

Figure 2:
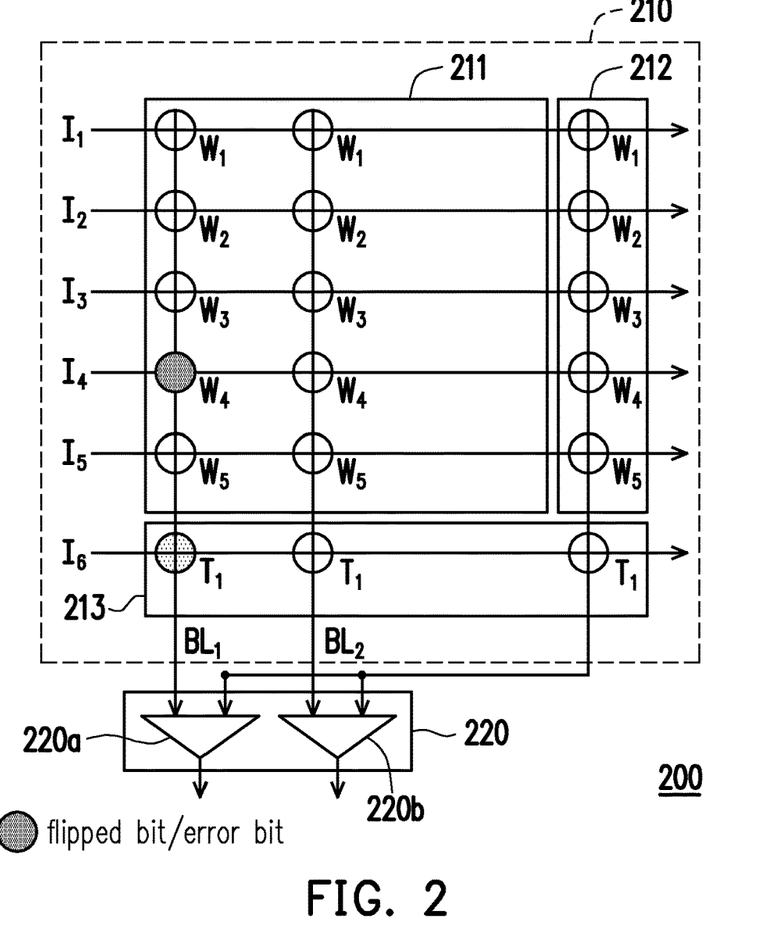
FIG. 2 illustrates a schematic diagram of a memory device according to an exemplary embodiment of the disclosure.

FIG. 2 illustrates a schematic diagram of a memory device according to an exemplary embodiment of the disclosure. The memory device 200 includes a memory array 210 and a verify circuit 220. The memory array 210 includes a main array 211, a reference array 212, and a tie-breaker array 213.

The main array 211 in this embodiment includes bit lines BL1 and BL2. Each of the bit lines BL1 and BL2 includes five memory cells respectively programmed with weights W1 to W5 and receiving inputs I1 to I5. The number of the bit lines and the number of the memory cells in the main array 211 are not limited in this disclosure.

In some embodiments, the outputs of the bit lines BL1 and BL2 are product sums. In other words, the output of the bit line BL1 corresponds to the product sum of the inputs and weights of the memory cells in the bit line BL1 and the output of the bit line BL2 corresponds to the product sum of the inputs and weights of the memory cells in the bit line BL2. The product sum is determined as, $$\text{Product sum} = I_1 W_1 + I_2 W_2 + I_3 W_3 + I_4 W_4 + I_5 W_5$$

The parameters $I_1$~$I_5$ and the parameters $W_1$~$W_5$ in above equation represent a plurality of inputs to the memory cells on the bit line BL1 and the bit line BL2, and a plurality of weights of the memory cells in the main array 211.

The reference array 212 is configured to generate the verify voltage in accordance with a plurality of inputs I1 to I5 to the memory cells in the main array 211. The reference array 212 includes one column of memory cells arranged in a column direction with respect to the main array 211.

The tie-breaker array 213 includes a row of memory cells arranged in a row direction with respect to the main array 211. In some embodiments, the number of memory cells in the tie-breaker array 213 is equal to the number of memory cells in each row of the main array 211 and the number of memory cells of the reference array 212 in the row direction. In some embodiments, the number of memory cells in each row of the main array 211 is two and the number of memory cells of the reference array 212 in the row direction is one, and therefore the number of memory cells in the tie-breaker array 213 is three.

It is noted the configuration of the tie-breaker array 213 is not limited to the embodiments described above. In other embodiments, the number of rows of memory cells and/or the number of memory cells in each row configured in the tie-breaker array 213 may be changed according to the configurations of the memory device 200.

The tie-breaker array 213 is enabled when the memory cells in the main array 211 are in ambiguous state and used to adjust the verify voltage to make the product sum of the bit lines in the main array 211 to be in the unambiguous state.

The verify circuit 220 is configured to compare the output of each of a plurality of bit lines in the main array 211 with the verify voltage. The verify circuit 220 includes comparators 220a and 220b, which are electrically connected to the bit lines BL1 and BL2 in the main array 211. The comparator 220a compares the output of the bit line BL1 and the verify voltage to generate a comparison result. The comparator 220b compares the output of the bit line BL2 and the verify voltage to generate another comparison result.

The operation of the memory device 200 is shown in Table I. With reference to Table I, in the first case, the verify voltage is set as 0.75V and both the bit lines BL1 and BL2 are without a flipped bit/error bit, and accordingly the output of the bit line BL1 is 0.7V and the output of the bit line BL2 is 0.8V. In this case, the verify circuit 220 verifies that the output of the bit line BL1 is less than the verify voltage and the output of the bit line BL2 is greater than the verify voltage, and therefore determines the memory cells in the main array 211 are in the unambiguous state (indicated "OK" in table I) and determines the output of the bit line BL2 is the desired result.

TABLE I

| State | $1^{st}$ BL (V) | $2^{nd}$ BL (V) | Verification | Result |
|---|---|---|---|---|
| W/O flipped bit | 0.70 | 0.80 | 0.7 < 0.75 < 0.80 | OK |
| With flipped bit | 0.76 | 0.80 | 0.75 < 0.76, 0.75 < 0.80 | ambiguous |
| With Tie-breaker | 0.76 | 0.80 | 0.76 < 0.78 < 0.80 | OK |

In the case that a memory cell in the bit line BL1 is flipped as shown in FIG. 2, the output of the bit line BL1 becomes 0.76V. The output of the bit line BL2 is same as 0.8V. The verify circuit 220 verifies that both of the output of the bit line BL1 and the output of the bit line BL2 are greater than the verify voltage, and therefore determines the memory cells in the main array 211 are in an ambiguous state.

Since the memory cells in the main array 211 are determined to be in the ambiguous state, the tie-breaker array 213 is enabled to adjust the verify voltage. In detail, the tie-breaker array 213 is enabled to adjust a reference level of the verify voltage by +0.03V to increase the verify voltage from 0.75V to 0.78V. After adjusting the verify voltage, the verify circuit 220 compares the output of the bit line BL1 and the output of the bit line BL2 with the adjusted verify voltage, and verifies that the output of the bit line BL1 is less than the verify voltage and the output of the bit line BL2 is greater than the verify voltage, and therefore determines the memory cells in the main array 211 are in the unambiguous state (indicated "OK" in table I).

Based on the above, the tie-breaker array 213 is enabled to adjust the verify voltage such that a comparison result of the output of the bit line with the flipped bit and the verify voltage is distinguishable from a comparison result of the output of the bit line without the flipped bit, and thereby the memory cells in the main array 211 is in the unambiguous state and the correct output is obtained.

Figure 3:
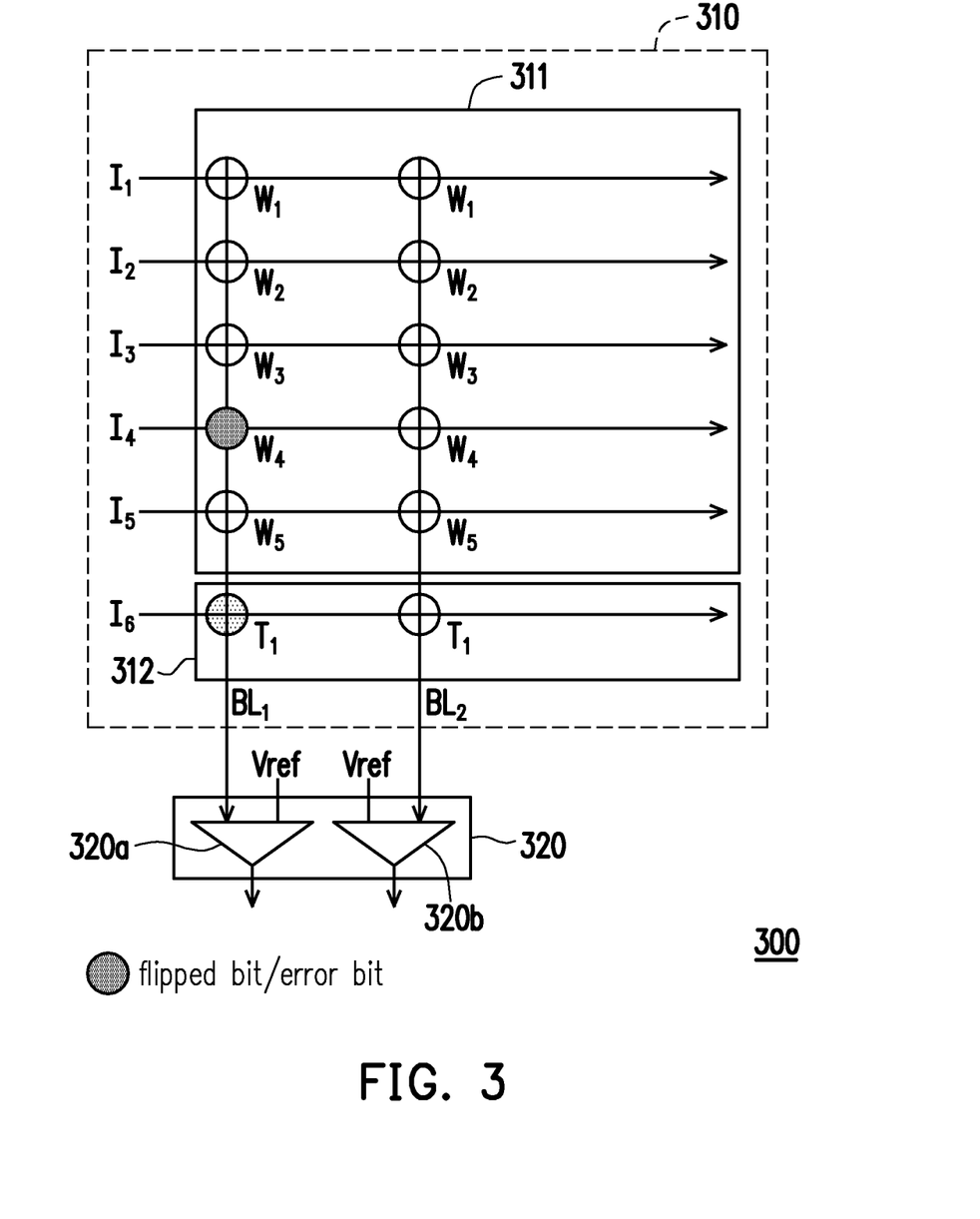
FIG. 3 illustrates a schematic diagram of a memory device according to an exemplary embodiment of the disclosure.

FIG. 3 illustrates a schematic diagram of a memory device according to an exemplary embodiment of the disclosure. The memory device 300 includes a memory array 310 and a verify circuit 320. The memory array 310 includes a main array 311 and a tie-breaker array 312.

The main array 311 in this embodiment includes bit lines BL1 and BL2. Each of the bit lines BL1 and BL2 includes five memory cells respectively programmed with weights W1 to W5 and receiving inputs I1 to I5. The number of bit lines and the number of the memory cells in the main array 311 are not limited in this disclosure.

The tie-breaker array 312 includes a row of memory cells arranged in a row direction with respect to the main array 311. It is noted that, the number of memory cells in the tie-breaker array 312 is same as the number of memory cells in each row of the main array 311 in the row direction.

The tie-breaker array 312 is enabled when the memory cells in the main array 311 are in ambiguous state, and used to adjust the output of the bit line BL1 with a flipped bit/error bit, to make the memory cells in the main array 211 be in the unambiguous state.

The verify circuit 320 are configured to compare the output of each of a plurality of bit lines in the main array 211 with the verify voltage Vref, which is generated from an external circuit in the embodiment. The verify circuit 320 includes comparators 320a and 320b, which respectively corresponds to the bit lines BL1 and BL2 in the main array 311. The comparator 320a compares the output of the bit line BL1 and the verify voltage Vref to generate a comparison result. The comparator 320b compares the output of the bit line BL2 and the verify voltage Vref to generate a comparison result.

The operation of the memory device 300 is shown in Table II. With reference to Table II, in the first case, the verify voltage Vref is provided as 0.75V and both the bit lines BL1 and BL2 are without a flipped bit/error bit, and accordingly the output of the bit line BL1 is 0.7V and the output of the bit line BL2 is 0.8V. In this case, the verify circuit 320 verifies that the output of the bit line BL1 is less than the verify voltage Vref and the output of the bit line BL2 is greater than the verify voltage Vref, and therefore determines the memory cells in the main array 311 are in the unambiguous state and determines the output of the bit line BL2 is the desired result.

TABLE II

| State | $1^{st}$ BL (V) | $2^{nd}$ BL (V) | Verification | Result |
|---|---|---|---|---|
| W/O flipped bit | 0.70 V | 0.80 | 0.7 < 0.75 < 0.80 | OK |
| With flipped bit | 0.78 | 0.80 | 0.75 < 0.78, 0.75 < 0.80 | ambiguous |
| With Tie-breaker | 0.70 | 0.80 | 0.70 < 0.75 < 0.80 | OK |

In the case that a memory cell in the bit line BL1 is flipped as shown in FIG. 3, the output of the bit line BL1 becomes 0.78V. The output of the bit line BL2 is same as 0.8V. The verify circuit 320 verifies that both of the output of the bit line BL1 and the output of the bit line BL2 are greater than the verify voltage Vref, and therefore determines the memory cells in the main array 311 are in the ambiguous state.

Since the memory cells in the main array 311 are determined to be in the ambiguous state, the tie-breaker array is enabled to adjust a reference level of the output of the bit line BL1 by −0.08V to decrease the output of the bit line BL1 from 0.78V to 0.70V. After adjusting the output of the bit line BL1, the verify circuit 320 compares the adjusted output of the bit line BL1 and the output of the bit line BL2 with the verify voltage Vref, and verifies that the output of the bit line BL1 is less than the verify voltage Vref and the output of the bit line BL2 is greater than the verify voltage Vref, and therefore determines the memory cells in the main array 311 are in the unambiguous state (indicated "OK" in table II).

Based on the above, the tie-breaker array 312 is enabled to adjust the output of the bit line BL1 such that a comparison result of the output of the bit line with the flipped bit and the verify voltage is distinguishable from a comparison result of the output of the bit line without the flipped bit, and thereby the correct output is obtained and reliability of the memory device 300 is enhanced.

In some embodiments, the tie-break array includes a plurality of rows of memory cells. The controller of the memory device is configured to adjust the output of the bit line with the flipped bit by enable one or more tie-breaker rows. In other words, when the flipped bit is determined during verification, the controller enables the tie-breaker rows to adjust the outputs of the bit lines to make the output of one bit line be greater than the verify voltage and make the output of the other bit line be less than the verify voltage. In some embodiments, the controller is configured to enable one row of the memory cells in the tie-breaker array to adjust the output of the bit line with the flipped bit, and sequentially increase the number of tie-breaker rows in the tie-breaker array until the memory cells in the bit lines are in the unambiguous state.

Figure 4:
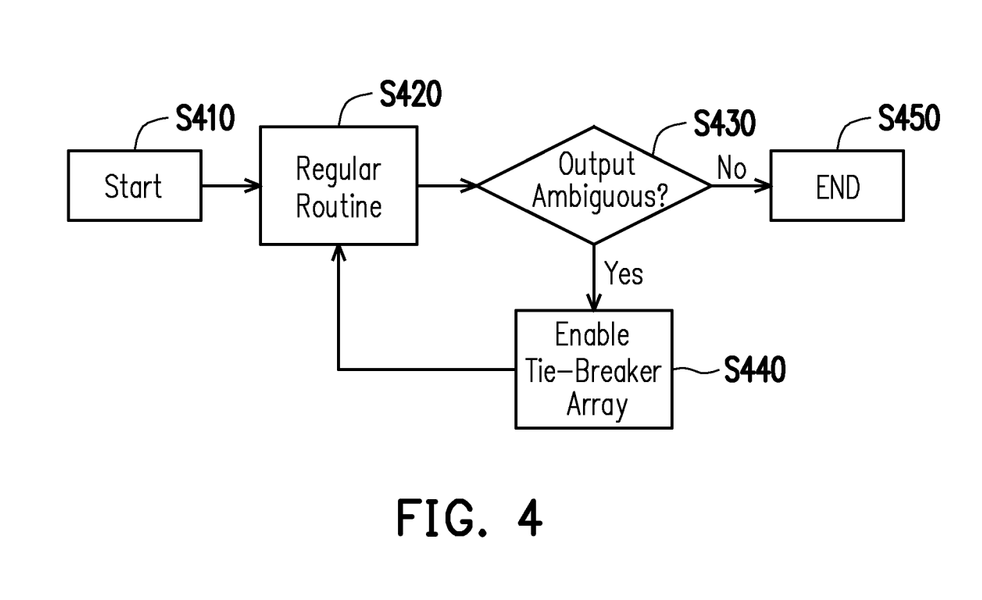
FIG. 4 illustrates a flow chart of an error correction method in a memory device according to an exemplary embodiment of the disclosure.

FIG. 4 illustrates a flow chart of error correction method in a memory device according to an exemplary embodiment of the disclosure. Referring to FIG. 1 and FIG. 4, the error correction method includes following operations.

In S410, the memory device 100 starts performing the programming operation on the memory array 110 by write controller 120.

In S420, the verify circuit 130 is configured to apply a verify voltage to the memory cells of the memory array 110. In some embodiments, the verify circuit 130 applies the verify voltage to verify the memory cells in the memory array 110 as a regular routine, that is, verifying the output of the bit line BL1 and the output of the bit line BL2 with the verify voltage.

In S430, the verify circuit 130 compares the outputs of the bit lines with the verify voltage to determine whether the output (i.e. comparison result) is ambiguous.

If a determination result shows that the output is not ambiguous, that is, in the unambiguous state, it represents there is no ambiguous result in the programming operation, and thereby the programming operation is done in S450.

On the other hand, if a determination result shows that the output is ambiguous, in S440, the controller 140 enables one row of memory cells in the tie-breaker array to adjust the output of the bit line BL1 or the bit line BL2 in the memory array 110 or adjust the verify voltage and the method returns back to S420. That is, after the adjustment, the verify circuit 130 again applies the verify voltage to verify the memory cells in the memory array 110 in S420 and determines whether output is ambiguous. If the output is ambiguous, in S440, the controller 140 enables an additional row of memory cells in the tie-breaker array to adjust the output of the memory array 110 or the verify voltage. The S420 to S440 are repeated until the verify circuit 130 determines the output is not ambiguous.

Based on the above, multiple rows of memory cells in the tie-breaker array are sequentially enabled to correct the error bit in the memory cells, and thereby reliability of the memory device 100 is enhanced.

Figure 5:
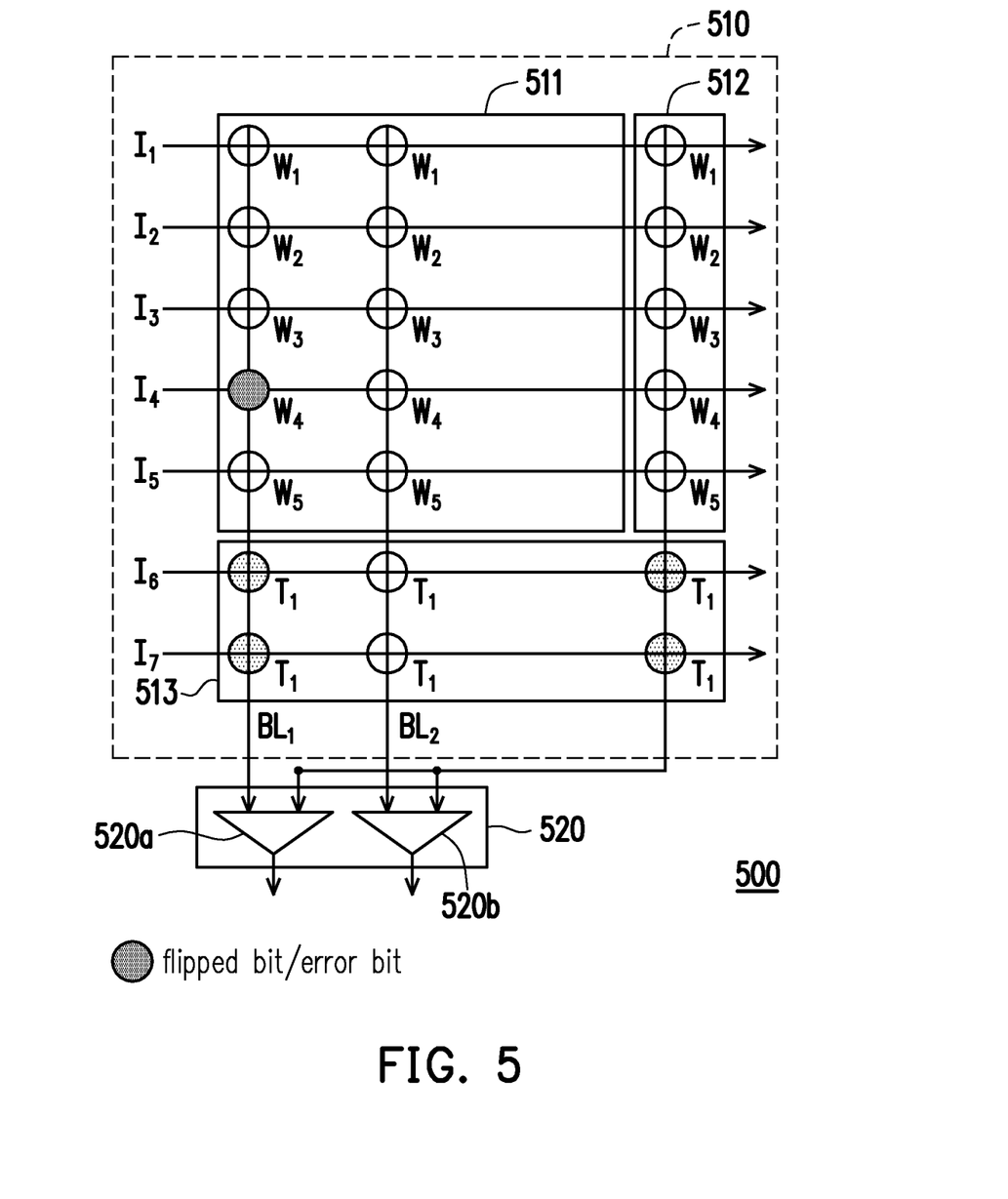
FIG. 5 illustrates a schematic diagram of a memory device according to an exemplary embodiment of the disclosure.

FIG. 5 illustrates a schematic diagram of a memory device according to an exemplary embodiment of the disclosure. The memory device 500 includes a memory array 510 and a comparator 520. The memory array 510 includes a main array 511, a reference array 512, and a tie-breaker array 513. The main array 511 and the reference array 512 are respectively similar to a main array 211 and a reference array 212 with reference to FIG. 2, thus the detailed descriptions are omitted herein.

The main array 511 in this embodiment includes bit lines BL1 and BL2. Each of the bit lines BL1 and BL2 includes five memory cells respectively programmed with weights W1 to W5 and receiving inputs I1 to I5. The number of the bit lines and the number of the memory cells in the main array 511 are not limited in this disclosure.

The reference array 512 is configured to generate the verify voltage in accordance with a plurality of inputs I1 to I5 to the memory cells in the main array 511. The reference array 512 includes one column of memory cells arranged in a column direction with respect to the main array 511. The reference array 512 is a copy of the main array 511, where the plurality of the inputs and the weights of the memory cells in the main array 511 are tied with the memory cells in the reference arrays 512. The verify voltage is a median voltage generated to verify the product sum of the bit lines in the memory cells.

The tie-breaker array 513 includes two rows of the memory cells arranged in a row direction with respect to the main array 511.

The two rows of the memory cells in the tie breaker array 513 are selectively enabled when the memory cells in the main array 511 are in an ambiguous state, so as to make the memory cells in the main array 211 be in the unambiguous state. In some embodiments, the rows of the memory cells in the tie-breaker array 213 are programmed by the controller 140 to adjust the verify voltage to make the memory cells in the main array 211 be in the unambiguous state.

The verify circuit 520 which includes comparators 520a and 520b is similar to the verify circuit 220 with reference to FIG. 2, thus the detailed descriptions are omitted herein.

The operation of the memory device 500 of one embodiment is shown in Table III. With reference to Table III, in the first case, the verify voltage is set as 0.75V and both the bit lines BL1 and BL2 are without a flipped bit/error bit, the output of the bit line BL1 is 0.7V and the output of the bit line BL2 is 0.8V. In this case, the verify circuit 520 verifies that the output of the bit line BL1 is less than the verify voltage and the output of the bit line BL2 is greater than the verify voltage, and therefore determines the memory cells in the main array 511 are in the unambiguous state (indicated "OK" in table III) and determines the output of the bit line BL2 is the desired result.

TABLE III

| State | $1^{st}$ BL (V) | $2^{nd}$ BL (V) | Verification | Result |
|---|---|---|---|---|
| W/O flipped bit | 0.70 | 0.80 | 0.7 < 0.75 < 0.80 | OK |
| With flipped bit | 0.78 | 0.80 | 0.75 < 0.78, 0.75 < 0.80 | Ambiguous |
| With first row | 0.78 | 0.80 | 0.77 < 0.78, 0.77 < 0.80 | Ambiguous |
| With second row | 0.78 | 0.80 | 0.77 < 0.78, 0.77 < 0.80 | Ambiguous |
| With both rows | 0.78 | 0.80 | 0.78 < 0.79 < 0.80 | OK |

In the case that a memory cell in the bit line BL1 is flipped as shown in FIG. 5, the output of the bit line BL1 becomes 0.78V. The output of the bit line BL2 is same as 0.8V. The verify circuit 520 verifies that both of the output of the bit line BL1 and the output of the bit line BL2 are greater than the verify voltage, and therefore determines the memory cells in the main array 511 are in the ambiguous state.

Since the memory cells in the main array 511 are determined to be in the ambiguous state, a first row of memory cells in tie-breaker array 513 is enabled to adjust the verify voltage. In detail, the first row of memory cells in the tie-breaker array 513 is enabled to adjust a reference level of the verify voltage by +0.02V (as shown in Table IV) to increase the verify voltage from 0.75V to 0.77V. After adjusting the verify voltage, the verify circuit 520 compares the output of the bit line BL1 and the output of the bit line BL2 with the adjusted verify voltage, and verifies that both of the output of the bit line BL1 and the output of the bit line BL2 are still greater than the verify voltage, and therefore determines the memory cells in the main array 511 are in the ambiguous state. As shown in Table IV, the same result is obtained if the second row of memory cells in tie-breaker array 513 is enabled to adjust the verify voltage.

TABLE IV

| State | Change in the verify voltage (V) |
|---|---|
| W/O tie-breaker array | 0 V |
| Enable first row | +0.02 |
| Enable second row | +0.02 |
| Enable both rows | +0.04 |

It is noted that, in the case that both rows of the memory cells in the tie-breaker array 511 are enabled, the verify voltage is adjusted by +0.04 and increased from 0.75V to 0.79V. After adjusting the verify voltage, the verify circuit 520 compares the output of the bit line BL1 and the output of the bit line BL2 with the adjusted verify voltage, and verifies that the output of the bit line BL1 is less than the verify voltage and the output of the bit line BL2 is greater than the verify voltage, and therefore determines the memory cells in the main array 511 are in the unambiguous state.

The operation of the memory device 500 of another embodiment is shown in Table V. With reference to Table V, in the first case that both the bit lines BL1 and BL2 are without a flipped bit/error bit, the output of the bit line BL1 is 0.7V, the output of the bit line BL2 is 0.8V, and the verify voltage is 0.75V. In this case, the verify circuit 520 verifies that the output of the bit line BL1 is less than the verify voltage and the output of the bit line BL2 is greater than the verify voltage, and therefore determines the memory cells in the main array 511 are in the unambiguous state (indicated "OK" in table V) and determines the output of the bit line BL2 is the desired result.

TABLE V

| State | $1^{st}$ BL (V) | $2^{nd}$ BL (V) | Verification | Result |
|---|---|---|---|---|
| W/O flipped bit | 0.70 | 0.80 | 0.7 < 0.75 < 0.80 | OK |
| With flipped bit | 0.78 | 0.80 | 0.75 < 0.78, 0.75 < 0.80 | Ambiguous |
| With first row | 0.76 | 0.80 | 0.75 < 0.76, 0.75 < 0.80 | Ambiguous |
| With second row | 0.76 | 0.80 | 0.75 < 0.76, 0.75 < 0.80 | Ambiguous |
| With both rows | 0.74 | 0.80 | 0.74 < 0.75 < 0.80 | OK |

In the case that a memory cell in the bit line BL1 is flipped, the output of the bit line BL1 becomes 0.78V. The output of the bit line BL2 is same as 0.8V. Accordingly, the verify circuit 520 determines the memory cells in the main array 511 are in the ambiguous state.

Since the memory cells in the main array 511 are determined to be in the ambiguous state, a first row of memory cells in tie-breaker array 513 is enabled to adjust the verify voltage. In detail, the first row of the memory cells in the tie-breaker array 513 is enabled to adjust a reference level of the verify voltage by −0.02V (as shown in Table V) to decrease the output of the bit line BL1 from 0.78V to 0.76V. After adjusting the output of the bit line BL1, the verify circuit 520 compares the adjusted output of the bit line BL1 and the output of the bit line BL2 with the verify voltage, and verifies that both of the output of the bit line BL1 and the output of the bit line BL2 are still greater than the verify voltage, and therefore determines the memory cells in the main array 511 are in the ambiguous state. As shown in Table VI, the same result is obtained if the second row of memory cells in tie-breaker array 513 is enabled to adjust the verify voltage.

TABLE VI

| State | Change in output of bit line (V) |
|---|---|
| W/O tie-breaker array | 0 V |
| Enable first row | −0.02 |
| Enable second row | −0.02 |
| Enable both rows | −0.04 |

It is noted that, in the case that both rows of the memory cells in the tie-breaker array 511 are enabled, the output of the bit line BL1 is adjusted by −0.04 and decreased from 0.78V to 0.74V. After adjusting the output of the bit line BL1, the verify circuit 520 compares the adjusted output of the bit line BL1 and the output of the bit line BL2 with the verify voltage, and verifies that the adjusted output of the bit line BL1 is less than the verify voltage and the output of the bit line BL2 is greater than the verify voltage, and therefore determines the memory cells in the main array 511 are in the unambiguous state.

Figure 6:
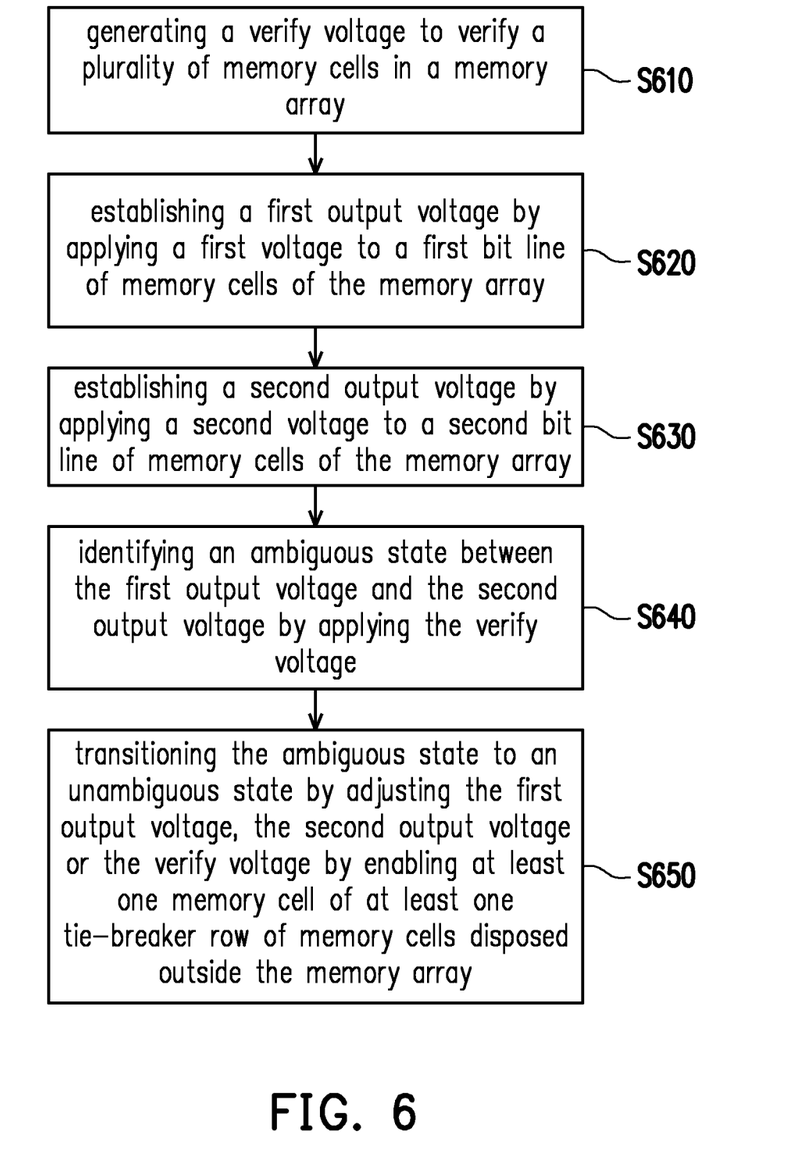
FIG. 6 illustrates a flow chart of an error correction method in a memory device according to an exemplary embodiment of the disclosure.

FIG. 6 illustrates a flow chart of error correction method in a memory device according to an exemplary embodiment of the disclosure. The error correction method in memory device includes the operations of: generating a verify voltage for verifying a plurality of memory cells in a memory array in step S601; establishing a first output voltage, which is a product sum of a first bit line of memory cells of the memory array, by applying a first voltage to the first bit line in step S602; establishing a second output voltage, which is a product sum of a second bit line of memory cells of the memory array, by applying a second voltage to the second bit line of memory cells of the memory array in step S630; identifying an ambiguous state between the first output voltage and the second output voltage by applying the verify voltage in step S640; and transitioning the ambiguous state to an unambiguous state by adjusting the first output voltage, the second output voltage or the verify voltage by enabling at least one memory cell of at least one tie-breaker row of memory cells disposed outside the memory array in step S650. In other words, the tie-breaker array is enabled to make one of the outputs of the bit lines BL1 and BL2 be greater than the verify voltage and the other one of the outputs of the bit line BL1 or BL2 be less than the verify voltage.

Based on the above error correction method, one or more tie-breaker rows in the tie-breaker array are enabled by the controller to adjust the product sum of the bit lines with the error bit in the memory cells, and thereby the correct output is obtained and reliability of the memory device is enhanced.

According to some embodiments, the disclosure provides a memory device. The memory device controller includes a memory array, a tie-breaker array, a write controller, a verify circuit, and a controller. The memory array includes a plurality of memory cells. The tie-breaker array includes a plurality of tie-breaker rows. The write controller is configured to apply a programming voltage to the memory array. The verify circuit is configured to apply a verify voltage to verify whether the memory cells in the memory array are in an unambiguous state or not. The controller is configured to enable one or more tie-breaker rows in addition to the memory array to adjust an output of the memory array when the memory cells in the memory array are in an ambiguous state.

According to some embodiments, the disclosure provides a memory device which includes a memory array, a reference array, a tie-breaker array, a write controller, a verify circuit, and a controller. The memory array includes a plurality of memory cells. The reference array is configured to generate a verify voltage in accordance with a plurality of inputs to the memory array. The tie-breaker array includes a plurality of tie-breaker rows. The write controller is configured to apply a programming voltage to the memory array. The verify circuit is configured to apply the verify voltage to verify whether the memory cells in the memory array are in an unambiguous state or not. The controller is configured to enable one or more tie-breaker rows disposed in addition to the memory array to adjust the verify voltage generated by the reference array so as to adjust an output of the memory array or the verify voltage when the memory cells in the memory array are in an ambiguous state.

According to some embodiments, the disclosure provides a method: generating a verify voltage to verify a plurality of memory cells in a memory array are in an unambiguous state or an ambiguous state; establishing a first output voltage by applying a first voltage to a first bit line of memory cells of the memory array; identifying the ambiguous state between the first output voltage and the second output voltage by applying the verify voltage; and transitioning the ambiguous state to the unambiguous state by adjusting the first output voltage, the second output voltage or the verify voltage by enabling at least one memory cell of at least one tie-breaker row of memory cells disposed outside the memory array.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device comprising:
a memory array, comprising a plurality of memory cells and a plurality of bit lines, each of the bit lines being connected to a set of the plurality of memory cells;
a tie-breaker array, comprising a plurality of tie-breaker rows, each of the plurality of tie-breaker rows comprising a row of memory cells;
a write controller, configured to apply a programming voltage to the memory array;
a verify circuit, configured to apply a verify voltage to verify whether the memory cells in the memory array are in an unambiguous state or not; and
a controller, configured to enable one or more of the tie-breaker rows to adjust an output of the memory array when the memory cells in the memory array are in an ambiguous state, wherein the controller is configured to set the memory cell in the enabled one or more of the tie-breaker rows that is connected to the bit line with a flipped bit to adjust the output of the bit line with the flipped bit.

2. The memory device of claim 1, wherein the controller is configured to calculate a product sum of inputs to the set of the memory cells and weights programmed to the set of the memory cells.

3. The memory device of claim 1, wherein the verify circuit comprises:
a plurality of comparators, respectively connected to the bit lines and configured to compare an output of each of the bit lines and the verify voltage.

4. The memory device of claim 3, wherein the verify circuit verifies the memory cells in the bit lines are in the ambiguous state if a comparison result of the comparator connected to the bit line with the flipped bit is the same as a comparison result of the comparator connected to the bit line without the flipped bit.

5. The memory device of claim 4, wherein the controller is configured to enable a number of the one or more tie-breaker rows to adjust the output of the bit line with the flipped bit.

6. The memory device of claim 1, wherein the controller is configured to sequentially increase the number of tie-breaker rows being enabled until the verify circuit verifies the memory cells in the bit lines are in the unambiguous state.

7. The memory device of claim 1, wherein the verify voltage is provided by an external device.

8. A memory device comprising:
a memory array, comprising a plurality of memory cells;
a reference array, configured to generate a verify voltage in accordance with a plurality of inputs to the memory array;
a tie-breaker array, comprises a plurality of tie-breaker rows;
a write controller, configured to apply a programming voltage to the memory array;
a verify circuit, configured to apply the verify voltage to verify whether the memory cells in the memory array are in an unambiguous state or not; and
a controller, configured to enable one or more of the tie-breaker rows disposed in addition to the memory array to adjust the verify voltage generated by the reference array so as to adjust an output of the memory array when the memory cells in the memory array are in an ambiguous state.

9. The memory device of claim 8, wherein the memory array comprises:
a plurality of bit lines, each of the bit lines comprising a set of the memory cells, and the controller is configured to calculate a product sum of inputs to the set of the memory cells and weights programed to the set of the memory cells.

10. The memory device of claim 9, wherein the verify circuit comprises:
a plurality of comparators, respectively connected to the bit lines and configured to compare an output of each of the bit lines and the verify voltage.

11. The memory device of claim 10, wherein the verify circuit verifies the memory cells in the bit lines are in the ambiguous state if a comparison result of the comparator connected to the bit line with a flipped bit is same as a comparison result of the comparator connected to the bit line without the flipped bit.

12. The memory device of claim 11, wherein the controller is configured to set the memory cell connected to the bit line with the flipped bit in the one or more tie-breaker rows to adjust the output of the bit line with the flipped bit.

13. The memory device of claim 11, wherein the controller s configured to enable a number of the one or more tie-breaker rows to adjust the output of the bit line with the flipped bit.

14. The memory device of claim 12, wherein the controller is configured to sequentially increase the number of tie-breaker rows being enabled until the verify circuit verifies the memory cells in the bit lines are in the unambiguous state.

15. The memory device of claim 12, wherein the controller is configured to set the memory cell connected to the reference array in the one or more tie-breaker rows to adjust the verify voltage generated by the reference array.

16. A method comprising:
generating a verify voltage for verifying a plurality of memory cells in a memory array are in an unambiguous state or an ambiguous state;
establishing a first output voltage by applying a first voltage to a first bit line of memory cells of the memory array;
establishing a second output voltage by applying a second voltage to a second bit line of memory cells of the memory array;
identifying the ambiguous state between the first output voltage and the second output voltage by applying the verify voltage; and
transitioning the ambiguous state to the unambiguous state by adjusting the first output voltage, the second output voltage or the verify voltage by enabling at least one memory cell of at least one tie-breaker row of memory cells disposed outside the memory array.

17. The method of claim 16, wherein the verifying comprises:
verifying the memory cells in a plurality bit lines in the memory array are in the ambiguous state if a comparison result of comparing an output of the bit line with a flipped bit and the verify voltage is the same as a comparison result of comparing an output of the bit line without the flipped bit and the verify voltage.

18. The method of claim 17, wherein the enabling comprises:
setting the memory cell connected to the bit line with the flipped hit in the one or more tie breaker rows to adjust the output of the bit line with the flipped bit.

19. The method of claim 17, wherein the enabling comprises:
setting the memory cell connected to a reference array generating the verify voltage in the one or more tie-breaker rows to adjust the verify voltage.

20. The method of claim 17, wherein the enabling comprises:
enabling a number of the at least one tie-breaker row to adjust the output of the bit line with the flipped bit; and
sequentially increasing the number of the at least one tie-breaker rows being enabled until the memory cells in the bit lines are verified as being in the unambiguous state.

* * * * *